(12) United States Patent
Leng

(10) Patent No.: US 11,804,803 B2
(45) Date of Patent: Oct. 31, 2023

(54) TECHNIQUES FOR FORMING INTEGRATED INDUCTOR-CAPACITOR OSCILLATORS AND RELATED METHODS, OSCILLATORS, SEMICONDUCTOR DEVICES, SYSTEMS-ON-CHIPS, AND OTHER SYSTEMS

(71) Applicant: Microchip Technology Incorporated, Chandler, AZ (US)

(72) Inventor: Yaojian Leng, Portland, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 254 days.

(21) Appl. No.: 16/837,660

(22) Filed: Apr. 1, 2020

(65) Prior Publication Data

US 2021/0218365 A1 Jul. 15, 2021

Related U.S. Application Data

(60) Provisional application No. 62/961,635, filed on Jan. 15, 2020.

(51) Int. Cl.
*H03B 5/12* (2006.01)
*H01F 27/28* (2006.01)
(Continued)

(52) U.S. Cl.
CPC ............ *H03B 5/12* (2013.01); *H01F 27/2804* (2013.01); *H01L 21/707* (2013.01);
(Continued)

(58) Field of Classification Search
CPC .................. H03B 5/12; H01F 27/2804; H01F 2027/2809; H01L 21/707; H01L 27/016;
(Continued)

(56) References Cited

U.S. PATENT DOCUMENTS 6,362,012 B1 3/2002 Chi et al.
8,344,479 B2 1/2013 Pitts et al.
(Continued)

FOREIGN PATENT DOCUMENTS

| CN | 107452710 A | 12/2020 | |
|---|---|---|---|
| CN | 113224038 A | * 8/2021 | ............ H01L 21/82 |
| EP | 1425844 B1 | 1/2011 | |

OTHER PUBLICATIONS

Chen et al., "On-Chip Spiral Inductors for RF Applications: An Overview," Journal of Semiconductor Technology and Science, Sep. 2004, vol. 4, No. 3, pp. 149-167.
(Continued)

*Primary Examiner* — Jarrett J Stark
(74) *Attorney, Agent, or Firm* — TraskBritt

(57) ABSTRACT

A system-on-chip may include an inductor-capacitor oscillator monolithically integrated into the system-on-chip The inductor-capacitor oscillator may be configured to improve frequency stability and reduce noise when compared to a resistor-capacitor oscillator. Methods of making integrated oscillators may involve forming an inductor at least partially while forming a BEOL structure on a substrate. A capacitor supported on and/or embedded within the semiconductor material of the substrate may be formed before or while forming the BEOL structure. The inductor may be connected to the capacitor in parallel at least partially utilizing the BEOL structure to form an integrated inductor-capacitor oscillator.

19 Claims, 11 Drawing Sheets

(51) Int. Cl.
  *H01L 21/70* (2006.01)
  *H01L 27/01* (2006.01)
  *H01L 49/02* (2006.01)
(52) U.S. Cl.
  CPC ............ *H01L 27/016* (2013.01); *H01L 28/10* (2013.01); *H01L 28/60* (2013.01); *H01F 2027/2809* (2013.01)
(58) Field of Classification Search
  CPC ..... H01L 28/10; H01L 28/60; H01L 23/5223; H01L 28/40; H01L 23/5227
  See application file for complete search history.

(56) References Cited

U.S. PATENT DOCUMENTS

| | | |
|---|---|---|
| 10,199,157 B2 | 2/2019 | Tsai et al. |
| 2006/0220760 A1* | 10/2006 | Floyd ........................ H01P 5/10 333/26 |
| 2008/0157217 A1* | 7/2008 | Burke ................. H01L 23/5223 257/E29.345 |
| 2008/0237789 A1 | 10/2008 | He et al. |
| 2009/0284339 A1* | 11/2009 | Choi ........................ H03H 7/42 336/200 |
| 2009/0322447 A1 | 12/2009 | Daley et al. |
| 2012/0056297 A1 | 3/2012 | Akhtar et al. |
| 2012/0146741 A1* | 6/2012 | Yen ..................... H01L 23/5227 29/25.01 |
| 2014/0042612 A1 | 2/2014 | Liu et al. |
| 2016/0012958 A1* | 1/2016 | Li ........................ H01F 27/2823 336/192 |
| 2016/0099302 A1* | 4/2016 | Seidel ..................... H01L 28/40 257/532 |
| 2016/0254266 A1 | 9/2016 | Yang et al. |
| 2017/0149404 A1 | 5/2017 | Fsai et al. |
| 2017/0200547 A1 | 7/2017 | Yen et al. |
| 2017/0288707 A1 | 10/2017 | Yun et al. |
| 2017/0345559 A1 | 11/2017 | Vanukura |
| 2018/0096779 A1 | 4/2018 | Tsai et al. |
| 2018/0277624 A1 | 9/2018 | Schultz |
| 2019/0259701 A1 | 8/2019 | Cheng et al. |

OTHER PUBLICATIONS

U.S. Trademark Application No. 16/549,635, filed Aug. 23, 2019, entitled "Techniques for Making Integrated Inductors and Related Semiconductor Devices, Electronic Systems, and Methods".
International Search Report for International Application No. PCT/US2020/026171, dated Oct. 7, 2020, 9 pages.
International Written Opinion for International Application No. PCT/US2020/026171, dated Oct. 7, 2020, 9 pages.

* cited by examiner

TECHNIQUES FOR FORMING INTEGRATED INDUCTOR-CAPACITOR OSCILLATORS AND RELATED METHODS, OSCILLATORS, SEMICONDUCTOR DEVICES, SYSTEMS-ON-CHIPS, AND OTHER SYSTEMS

CROSS-REFERENCE TO RELATED APPLICATION

This application claims the benefit of the filing date of U.S. Provisional Patent App. Ser. No. 62/961,635, filed Jan. 15, 2020, the disclosure of which is incorporated herein in its entirety by this reference.

FIELD

This disclosure relates generally to techniques for forming integrated and/or internal inductor-capacitor oscillators, and related methods, inductor-capacitor oscillators, semiconductor devices, systems-on-chips, and systems. More specifically, disclosed embodiments relate to techniques for forming integrated and/or internal inductor-capacitor oscillators that may improve the accuracy and reliability of inductor-capacitor oscillators, reduce the number of additional processing acts to make the inductor-capacitor oscillators, and improve the ability to adopt system-on-a-chip approaches for modules relying on accurate timing.

BACKGROUND

In conventional integrated circuits (ICs) known to the inventor, a fully functional device with multiple, interconnected transistors is formed using transistors built monolithically on a silicon substrate and metal, usually aluminum or copper, wire to connect to the transistors. In addition to the transistors, other components that would conventionally be provided on a printed circuit board (PCB) may be built monolithically onto the same silicon substrate. This configuration is sometimes referred to in the art as a "system-on-chip" (SoC). Forming electronic components to produce a SoC configuration using techniques known to the inventor generally involve additional dedicated process steps, adding cost and delay to manufacturing processes.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
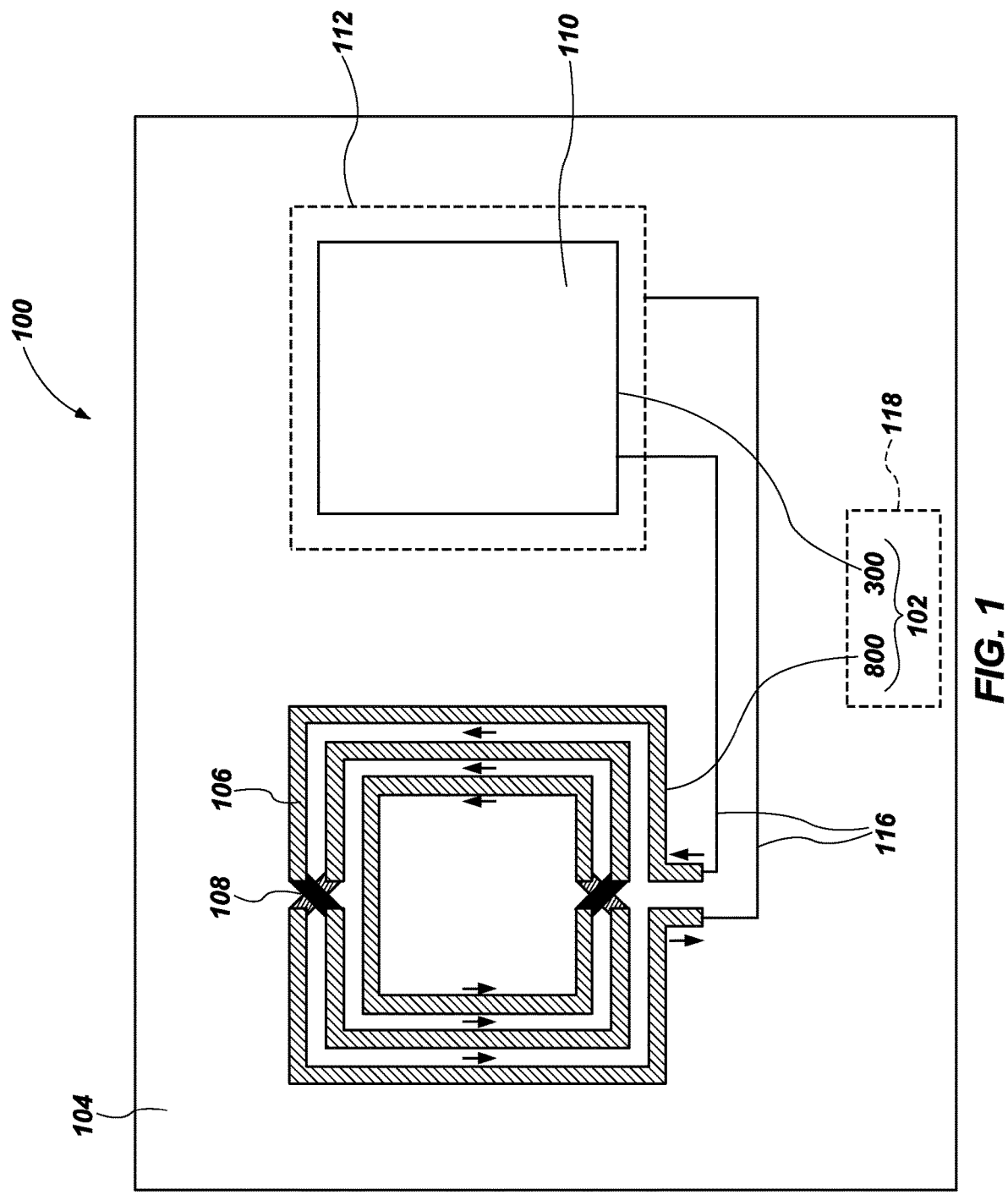
FIG. 1 is a schematic diagram of a substrate including a monolithically integrated inductor-capacitor oscillator in accordance with one embodiment of this disclosure.

The illustrations presented in this disclosure are not meant to be actual views of any particular microcontroller, system-on-chip, substrate, integrated inductor-capacitor oscillator, or component thereof, but are merely idealized representations employed to describe illustrative embodiments. Thus, the drawings are not necessarily to scale. Throughout this description, like reference numerals refer to the same or similar elements, regardless of whether those elements are expressly highlighted or discussed in connection with a given figure.

Disclosed embodiments relate generally to techniques for forming integrated and/or internal inductor-capacitor oscillators that may improve the accuracy and reliability of inductor-capacitor oscillators, reduce the number of additional processing acts to make the inductor-capacitor oscillators, and improve the ability to adopt system-on-a-chip approaches for modules relying on accurate timing as compared to oscillators known to the inventor of the subject matter of this disclosure. More specifically, disclosed are embodiments of integrated and/or internal oscillators for semiconductor devices that may include an inductor formed at least partially when forming a back-end-of-line (BEOL) structure on or above a substrate including semiconductor material and a capacitor supported on and/or embedded within the semiconductor material of the substrate before or while forming the BEOL structure. BEOL is the portion of IC fabrication where the individual devices get interconnected with wiring on the substrate utilizing one or more metallization layers. For example, formation of the BEOL structure typically begins when a first layer of metal is deposited on the substrate or when preparations are made to facilitate deposition of such a first layer of metal. Common metals used as metallization layers are copper and aluminum. BEOL structures conventionally include contacts (e.g., pads), insulating layers (dielectrics), metal levels (e.g., wires), and bonding sites (e.g., solder bumps, ball grid arrays) for chip-to-package connections.

For example, integrated and/or internal inductors for the inductor-capacitor oscillators may be formed at least partially utilizing processes for forming BEOL structures on or above substrates including semiconductor materials. Specific techniques for making such integrated inductors are disclosed in currently unpublished U.S. patent application Ser. No. 16/549,635, filed Aug. 23, 2019, and U.S. Provisional Patent App. Ser. No. 62/875,917, filed Jul. 18, 2019, the disclosure of each of which is incorporated herein in its entirety by this reference. Resulting inductors may be low-resistance and not sensitive to temperature fluctuations, producing high-quality inductors at low cost (e.g., no cost from a process perspective).

Integrated and/or internal capacitors for the inductor-capacitor oscillators may be formed at least partially utilizing unconventional processes for forming BEOL structures on, or above, substrates including semiconductor materials disclosed herein or utilizing state of the art processes known to the inventor. For example, an integrated capacitor may be formed utilizing a quantity of electrically conductive material partially surrounded by, and/or embedded within, a dielectric material as one of the plates of the capacitor. More specifically, the plate may be formed from one of the top-most wires created through a Damascene process on the substrate. A passivation material may be located over the dielectric material and the electrically conductive material, which may be put in place as part of the process for forming the BEOL structure. Holes extending through the passivation material to the plate may be formed utilizing a mask and etch process, which may be also occur as part of the process for forming the BEOL structure, and the specific positions for, and quantities of, the holes may differ when compared to state of the art techniques for forming the BEOL structure known to the inventor. A dielectric material (e.g., silicon nitride, silicon oxide, without limitation) may be positioned over the passivation material, over sidewalls defining the holes extending through the passivation material, and over the plate within the hole, and the dielectric material may be put in place as an additional process act when compared to state of the art techniques for forming the BEOL structure known to the inventor. A protective material may be positioned within a portion of one of the holes, which may be another additional process act when compared to the state of art techniques for forming the BEOL structure known to the inventor. For example, the protective material may be a photoresist material initially blanket deposited over exposed surfaces of the dielectric material to a thickness less than a depth of the hole and partially removed (e.g., by placing a mask overlying the photoresist material and exposing portions of the photoresist material accessible through the mask to light). Those quantities of the dielectric material not covered by, or laterally adjacent to, the protective material may be removed, and portions of the dielectric material laterally adjacent to the protective material in the hole may be incidentally removed, which may be still another additional process act when compared to state of the art techniques for forming the BEOL structure known to the inventor. The remaining protective material may be removed, leaving dielectric material overlying the plate within one of the holes extending to the plate and dielectric material extending longitudinally along portions of the sidewalls of the passivation material defining the relevant hole. Patterning, etching, and physical vapor deposition of electrically conductive material may form bond pads in the holes and extend above the passivation material to form another plate of the capacitor in, and overlying, the hole including the dielectric material utilizing one of the bond pads to form an electrical connection to the plate underlying the holes utilizing the other bond pad. Such a process may produce a high-quality, low-resistance, integrated, metal-insulator-metal (MIM) capacitor at low cost.

As an alternative embodiment, poly-oxide-poly (POP) capacitors may be formed to make integrated inductor-capacitor oscillators in accordance with this disclosure. As another alternative embodiment, a metal-oxide-semiconductor (MOS) varactor (e.g., a MOS capacitor) may be formed to make inductor-capacitor oscillators in accordance with this disclosure. For example, the POP capacitor(s) and/or MOS varactor(s) may be formed before formation of the BEOL.

A capacitor, or a bank of capacitors, formed in accordance with any of the foregoing techniques may be operatively connected to an inductor formed in accordance with the foregoing techniques to produce an inductor-capacitor oscillator in accordance with this disclosure. For example, the capacitor, or bank of capacitors, may be connected in parallel to the inductor. The capacitance of the inductor-capacitor oscillator may be trimmed to produce a desired resonant frequency for the inductor-capacitor oscillator, such as, for example, by connecting and/or disconnecting certain capacitors in the bank and/or utilizing on-board, non-volatile memory in the substrate.

Semiconductor devices (e.g., microcontrollers) including integrated inductor-capacitor oscillators in accordance with this disclosure may be capable of operating and communicating at a target frequency with a greater degree of accuracy and reliability when compared to semiconductor devices relying on in-package resistor-capacitor oscillators without connecting to another external or in-package oscillator (e.g., a crystal-based oscillator). For example, the inductor-capacitor oscillators disclosed herein are more accurate and less temperature sensitive than a resistor-capacitor oscillator configured to operate at a same resonant frequency. As a result, a wider variety of modules may be integrated into the semiconductor device at the chip level, enabling more flexibility for system-on-a-chip approaches. The integrated inductor-capacitor oscillators may also be produced utilizing few additional processing acts at low cost. Finally, the integrated inductor-capacitor oscillators may be of high quality (e.g., low resistance, low to no temperature variability, more stable frequency response, low susceptibility to noise) when compared to conventional oscillators.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

FIG. 1 is a schematic diagram of a substrate 100 including a monolithically integrated inductor-capacitor oscillator 102 in accordance with one embodiment of this disclosure. When it is said that the inductor-capacitor oscillator 102 is "monolithically integrated," what is meant is that the inductor-capacitor oscillator 102 is onboard the substrate 100 of a semiconductor device, as opposed to being a discrete component provided with, and connected to, a supporting structure to which the substrate 100 may be connected, such as, for example, a printed circuit board. For example, the monolithically integrated inductor-capacitor oscillator 102 may be a component of a system-on-a-chip configuration for semiconductor devices. The substrate 100 may include, for example, a semiconductor material 104, such as, for example, silicon. In some embodiments, the substrate 100 may be configured as, or include as a functional module within the substrate 100, a microcontroller. The inductor-capacitor oscillator 102 may be configured as, for example, a component of a clock or clock module, such as, for example, for timing in accordance with various communications protocols.

The inductor-capacitor oscillator 102 may include one or more inductors 800 electrically connected to one or more capacitors 300. For the sake of simplicity, only a single inductor 800 and capacitor 300 are depicted, but inductor-capacitor oscillators 102 in accordance with this disclosure may include multiple inductors 800, multiple capacitors 300, or multiple inductors 800 and multiple capacitors 300 (e.g., in respective banks or arrays) supported on, and monolithically integrated into, the substrate 100. Each inductor 800 may include, for example, coils 106 including electrically conductive material and overpass/underpass regions 108 enabling adjacent coils 106 to pass over and under one another, respectively, without electrically or otherwise operatively connecting to one another within the overpass/underpass regions 108. In some embodiments, each capacitor 300 may include, for example, a first plate 112 including an electrically conductive material, a second plate 110 including an electrically conductive material, and a dielectric material 315 (see FIG. 3) interposed between the first plate 112 and the second plate 110. The inductor(s) 800 and capacitor(s) 300 may be interconnected with one another, for example, in parallel to form the inductor-capacitor oscillator 102. More specifically, inductor(s) 800 and capacitor(s) 300 may be interconnected with one another by one or more connectors 116 in the form of, for example, wires, lines, traces, and/or other structures for routing electrical current, which may be part of the BEOL structure. The inductor capacitor oscillator 102 including the inductor(s) 800 and capacitor(s) 300 may form at least a portion of a timing signal generator 118 (e.g., a clock generator, without limitation) for the substrate 100.

Figure 2:
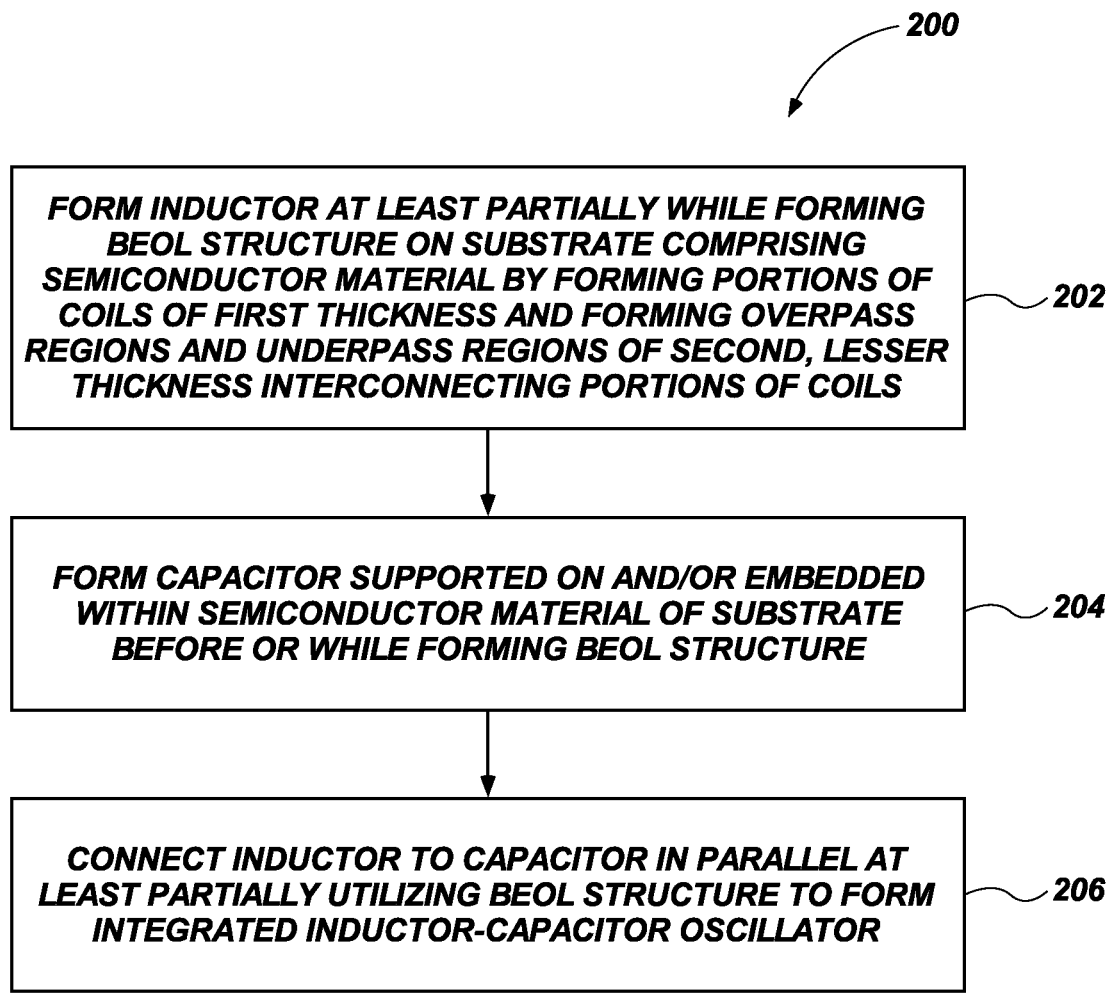
FIG. 2 is a flowchart of a method of making the inductor-capacitor oscillator of FIG. 1.

FIG. 2 is a flowchart of a method 200 of making an inductor-capacitor oscillator in accordance with this disclosure, such as the inductor-capacitor oscillator 102 of FIG. 1. The method 200 may involve, for example, forming an inductor (e.g., the inductor 800 of FIG. 1, without limitation) at least partially while forming a BEOL structure on a substrate comprising a semiconductor material, as indicated at act 202. More specifically, the inductor may be formed by forming portions of coils of a first thickness and forming overpass regions and underpass regions of a second, lesser thickness interconnecting the portions of the coils while forming the BEOL structure, as further indicated at act 202. As a specific, nonlimiting example, a portion of the inductor may be formed utilizing electrically conductive material (e.g., copper, a copper mixture, or a copper alloy) positioned on or over the substrate in connection with a final layer formed utilizing a Damascene process to form portions of the coils and to form the underpass regions of the overpass/underpass regions. Continuing the specific, nonlimiting example, another portion (e.g., a remainder) of the inductor may be formed utilizing another quantity of electrically conductive material (e.g., aluminum, an aluminum mixture, or an aluminum alloy) positioned over the substrate in connection with forming the BEOL structure to form remainders of the coils and to form the overpass regions of the overpass/underpass regions.

The method 200 may also involve forming a capacitor (e.g., the capacitor 300 of FIG. 1, without limitation) supported on and/or embedded within the semiconductor material of the substrate, as indicated at act 204. More specifically, the capacitor may be formed before or while forming the BEOL structure, as further indicated at act 204. In some embodiments where the capacitor is formed while forming the BEOL structure, a portion of the capacitor may be formed utilizing electrically conductive material (e.g., copper, a copper mixture, or a copper alloy) positioned on or over the substrate in connection with a final layer formed utilizing a Damascene process to form the first plate. In those same embodiments, another portion (e.g., a remainder) of the capacitor may be formed utilizing another quantity of electrically conductive material (e.g., aluminum, an aluminum mixture, or an aluminum alloy) positioned over the substrate in connection with forming the BEOL structure to form the second plate and an electrical connection to the first plate, and utilizing dielectric material positioned over the substrate in connection with forming the BEOL structure to form the dielectric region of the capacitor. In other embodiments where the capacitor is formed before forming the BEOL structure, the capacitor may be a POP capacitor or MOS varactor formed at least partially utilizing doped regions of the substrate.

Finally, the method 200 may involve connecting the inductor to the capacitor (e.g., utilizing the connectors 116 of FIG. 1, without limitation) in parallel to form an integrated inductor-capacitor oscillator, as indicated at act 206. More specifically, the inductor may be electrically connected to the capacitor at least partially utilizing the BEOL structure to form the inductor-capacitor oscillator. As a specific, nonlimiting example, the connectors 116 (see FIG. 1) may be in the form of wires, lines, traces, and/or other structures for directing electrical current within the BEOL structure, and may be formed concurrently with a remainder of the BEOL structure, including the inductor and/or the capacitor.

Figure 3:
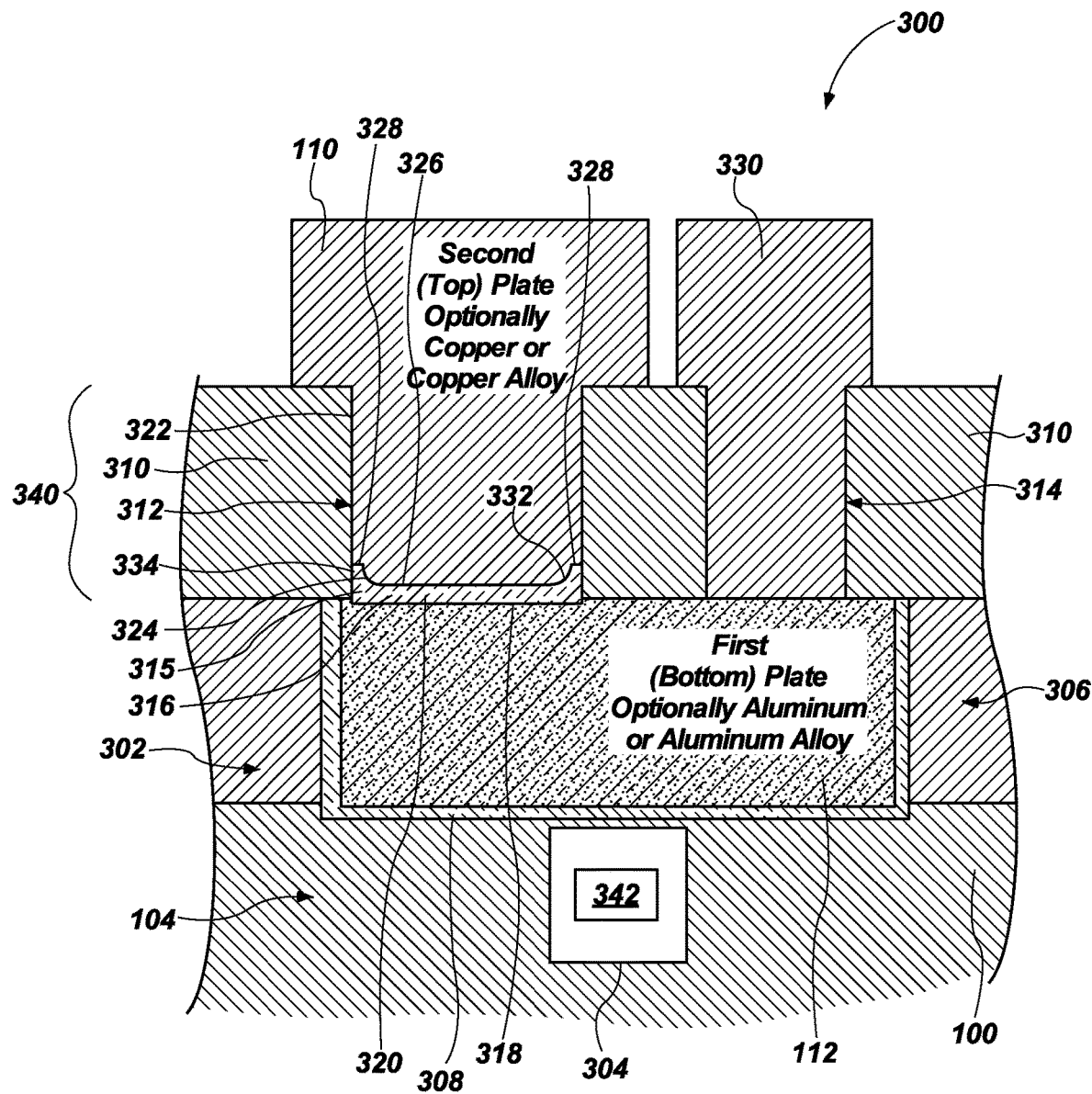
FIG. 3 is a cross-sectional view of an illustrative capacitor usable to form the inductor-capacitor oscillator of FIG. 1.

FIG. 3 is a cross-sectional view of an illustrative capacitor 300 usable to form the inductor-capacitor oscillator 102 of FIG. 1. The capacitor 300 may include, for example, a first plate 112, which may also be characterized as a "bottom plate," supported on or over the substrate 100. The first plate 112 may include, for example, a quantity of electrically conductive material positioned on or over the substrate 100 in connection with a final layer of an interconnect 302 formed utilizing a Damascene process. More specifically, the first plate 112 may include, for example, a mass of copper, copper mixture, or copper alloy forming the first plate 112, which may also be located within an uppermost layer of the interconnect 302 formed on the substrate 100 using a Damascene process. The interconnect 302 may be utilized in capacitor 300 to electrically and operatively connect to one or more transistor regions 304, which may also be characterized as "other integrated circuitry," including doped regions within the semiconductor material 104 of the substrate 100. In some embodiments, the transistor regions 304 may themselves include one or more capacitors 342 in the form of, for example, POP capacitor(s) and/or MOS varactor(s).

The first plate 112 may be supported within an other dielectric material 306 of the interconnect 302. The interconnect 302 may include, for example, regions of electrically conductive material and regions of the other dielectric material 306 selectively positioned to enable the regions of electrically conductive material (e.g., that of the first plate 112 and any other electrically conductive structures of the interconnect 302) to electrically interconnect selected electronic components without forming undesirable connections (e.g., short circuits). For example, the first plate 112 may be partially surrounded and supported by a barrier material 308 (e.g., Ta, TaN) interposed between the first plate 112 and the other dielectric material 306. The barrier material 308 may be positioned configured to reduce the likelihood that the material of the first plate 112 may come into contact with, and contaminate, the semiconductor material of the substrate 100. For the sake of simplicity of illustration, only an uppermost layer of the interconnect 302 is depicted in FIG. 3; however, interconnects in accordance with this disclosure may include additional layers, such as layers interposed between the first plate 112 and the substrate 100, without limitation. The other dielectric material 306 may include, for example, an oxide material (e.g., silicon oxide, silicon dioxide, without limitation).

A passivation material 310 may overlie at least a portion of the first plate 112, any exposed portions of the barrier material 308, and a major surface of the other dielectric material 306 on a side of the other dielectric material 306 opposite the substrate 100. For example, the passivation material 310 may cover portions of the first plate 112 and an entirety of the other dielectric material 306. The passivation material 310 may be positioned and configured to laterally surround at least a portion of the second plate 110 and to partially overlie the first plate 112 of the capacitor 300. The passivation material 310 may include, for example, oxides, nitrides, glasses, polymers, or combinations or subcombinations of these (e.g., silicon oxynitride, silicon oxide, silicon nitride, silicon-rich nitride, phosphosilicate glass, without limitation).

Figure 5:
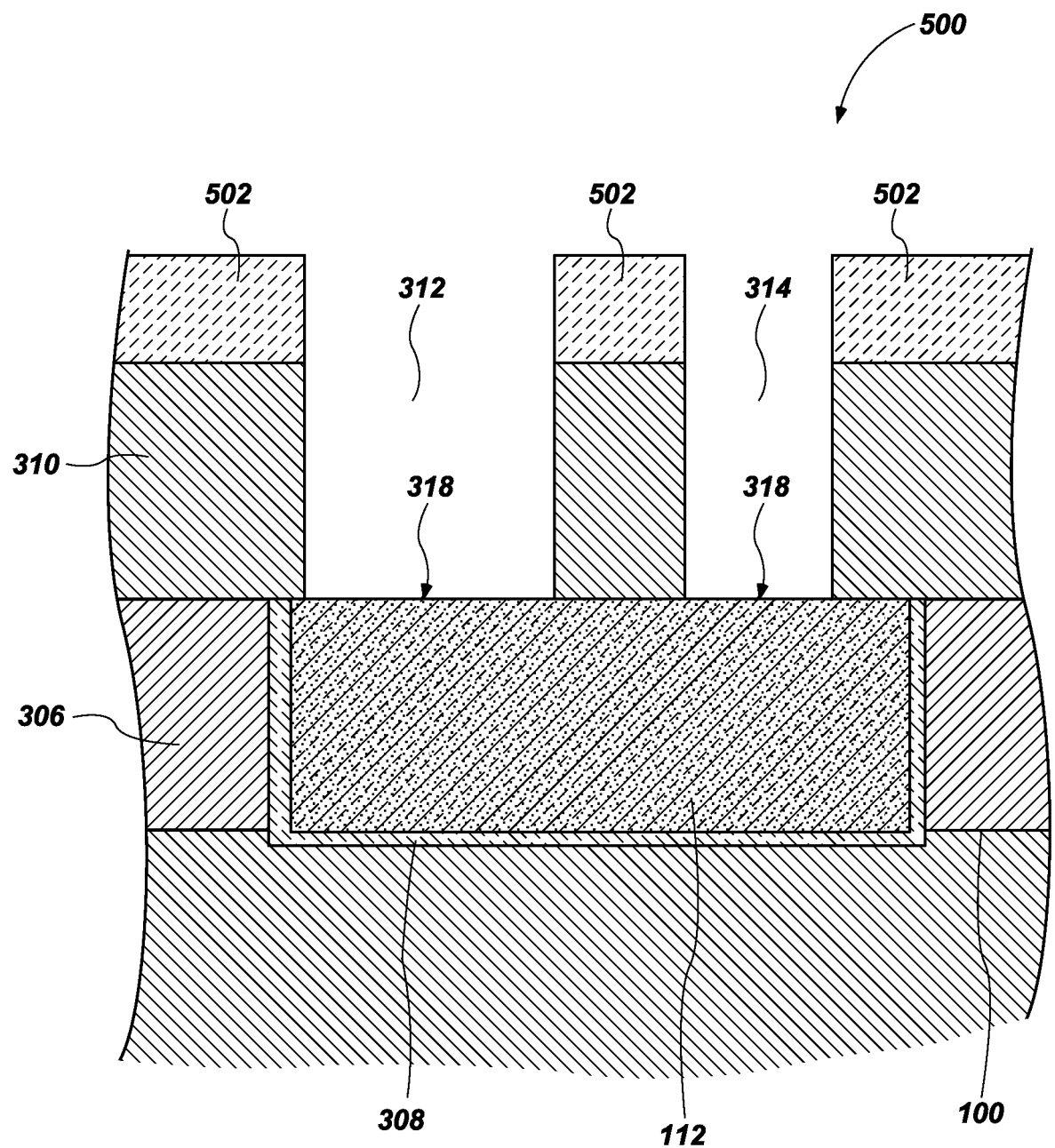
FIG. 5 is a cross-sectional view of a second intermediate product in the method of making the capacitor of FIG. 3.

A first hole 312 may extend through the passivation material 310, from a side of the passivation material 310 opposite the first plate 112 toward the first plate 112, in a first location overlying the first plate 112, and a second hole 314 may extend through the passivation material 310 in the same direction and in a second, offset location overlying the first plate 112. For additional clarity, please refer to FIG. 5, depicting the first hole 312 and the second hole 314 when in an unoccupied state. For the sake of clarity, the lead lines associated with reference numerals 312 and 314 terminate at the sidewalls of the passivation material 310 defining the first hole 312 and the second hole 314, rather than terminating within the electrically conductive material occupying the first hole 312 and the second hole 314 in FIG. 3. The first hole 312 may be positioned and configured to, for example, support and define a dielectric region 316 and a second plate 110 of the capacitor 300 at least partially within the first hole 312, placing the dielectric region 316 adjacent to the first plate 112 and the second plate 110 adjacent to the dielectric region 316 on a side of the dielectric region 316 opposite the first plate 112. For example, the dielectric region 316, which may also be characterized as an "insulator," of the capacitor 300 including the dielectric material 315 may be positioned in the first hole 312 adjacent to the first plate 112. The dielectric region 316 may be positioned and configured to separate the first plate 112 and the second plate 110 of the capacitor 300 from one another physically and electrically, and properties (e.g., electrical resistance, mass, thickness) of the dielectric material 315 may at least partially determine properties (e.g., capacitance, breakdown voltage) of the capacitor 300. The second hole 314 may be positioned and configured to, for example, support and define an electrical connection 330 for electrically connecting to the first plate 112 of the capacitor 300 through the passivation material 310. A second plate 110 of the capacitor 300 may, for example, occupy a remainder of the first hole 312 and extend from direct, conformal contact with the dielectric region 316 at least to an opening of the first hole 312 located opposite the substrate 100, and optionally laterally and longitudinally beyond the opening.

For example, the dielectric region 316 may extend laterally along, and cover, a surface 318 of the first plate 112 that would otherwise be exposed within the first hole 312. More specifically, a first portion 320 of the dielectric material 315 of the dielectric region 316 may be, for example, in direct contact with the surface 318 of the first plate 112 and extend laterally across an entire surface area of the first hole 312 as projected onto the surface 318 of the first plate 112, occluding the first hole 312. The dielectric material 315 of the dielectric region 316 may further extend along, and cover, for example, a portion of the sidewall 322 of the passivation material 310 defining the first hole 312. More specifically, a second portion 334 of the dielectric material 315 of the dielectric region 316 may be, for example, in direct contact with a portion of the sidewall 322 of the passivation material 310 defining the first hole 312 extending from a location proximate to the first plate 112, away from the first plate 112, to a location within the first hole 312 along the sidewall 322. A transition from the first portion 320 of the dielectric material 315 to the second portion 334 may be, for example, gradual. More specifically, at least an internal corner 324 of the dielectric material 315 at the transition from the first portion 320 to the second portion 334 may be rounded. As a specific, nonlimiting example, the dielectric material 315 of the dielectric region 316 may form a cup shape (e.g., a hollow at least substantially right cylinder having one closed end) supported on the first plate 112 within the first hole 312. The dielectric material 315 of the dielectric region 316 may include, for example, an oxide or nitride material (e.g., SiO, SiN).

A second plate 110, which may also be characterized as a "top plate," of the capacitor 300 may be at least partially located within the first hole 312. For example, the second plate 110 may include another quantity of electrically conductive material positioned on the dielectric region 316 in connection with formation of the BEOL structure 340, which may include and form, for example, at least a portion of the second plate 110, at least a portion of the electrical connection 330, and the passivation material 310. More specifically, the second plate 110 may include, for example, a mass of aluminum, aluminum mixture, or aluminum alloy located within a lowermost layer of the passivation material 310 supported over the substrate 100 while forming the BEOL structure 340. For the sake of simplicity of illustration, only the lowermost layer of a BEOL structure 340 is depicted in FIG. 3, however, BEOL structures in accordance with this disclosure may include additional layers, such as layers located on a side of the depicted second plate 110 opposite the substrate 100, without limitation. As a specific, nonlimiting example, the second plate 110 may include a mass of electrically conductive material occupying a remainder of the first hole 312 and extending from direct, conformal contact with the dielectric material 315 of the dielectric region 316 at least to an opening of the first hole 312 located opposite the substrate 100, and optionally laterally and longitudinally beyond the opening, in the form of a first bond pad. The dielectric material 315 of the dielectric region 316 may be located longitudinally between the first plate 112 and the second plate 110, may extend longitudinally along a portion of a periphery of the second plate 110, and extend laterally across a surface of the second plate 110 confined by the sidewalls 322 defining the first hole 312.

A transition from a surface 326 of the second plate 110 abutting the dielectric region 316 to a lateral side surface 328 of the second plate 110 abutting the second portion 334 of the dielectric region 316 and the sidewall 322 of the first hole 312 may be, for example, gradual. More specifically, at least an external corner 332 of the second plate 110 at the transition from the surface 326 proximate to the first plate 112 to the lateral side surface 328 may be rounded (e.g., radiused) by conforming the electrically conductive material of the second plate 110 to a shape of the dielectric material 315 within the first hole 312. By way of nonlimiting example, rendering the corner 324 of the dielectric region 316, and the corner 332 of the adjacent second plate 110, rounded may increase the breakdown voltage of the capacitor 300 because the rounded corners 324, 332 may reduce concentration of electric field that would otherwise occur if the corners 324, 332 were sharp (i.e., not rounded).

An electrical connection 330 to the first plate 112 of the capacitor 300 may be located within a second hole 314 defined through the passivation material 310. For example, the electrical connection 330 may include a quantity of electrically conductive material in direct contact with a portion of the surface 318 the first plate 112 within the second hole 314 and occupying at least substantially an entirety of the second hole 314. More specifically, the electrical connection 330 may include, for example, a mass of aluminum, aluminum mixture, or aluminum alloy located within a lowermost layer of the passivation material 310 supported over the substrate 100 while forming the BEOL structure 340. As a specific, nonlimiting example, the electrical connection 330 may include a mass of electrically conductive material occupying at least substantially an entirety of the second hole 314 from a location interfacing (e.g., in direct contact, without limitation) with surface 318 of the first plate 112 to a location proximate an opening of the second hole 314 and located opposite the substrate 100. Optionally, the mass of electrically conductive material may extend laterally and longitudinally beyond the opening of the second hole 314, in the form of a second bond pad. Electrical connection to the capacitor 300 may be accomplished by electrically connecting directly to the second plate 110 and indirectly to the first plate 112 via the electrical connection 330.

Figure 4:
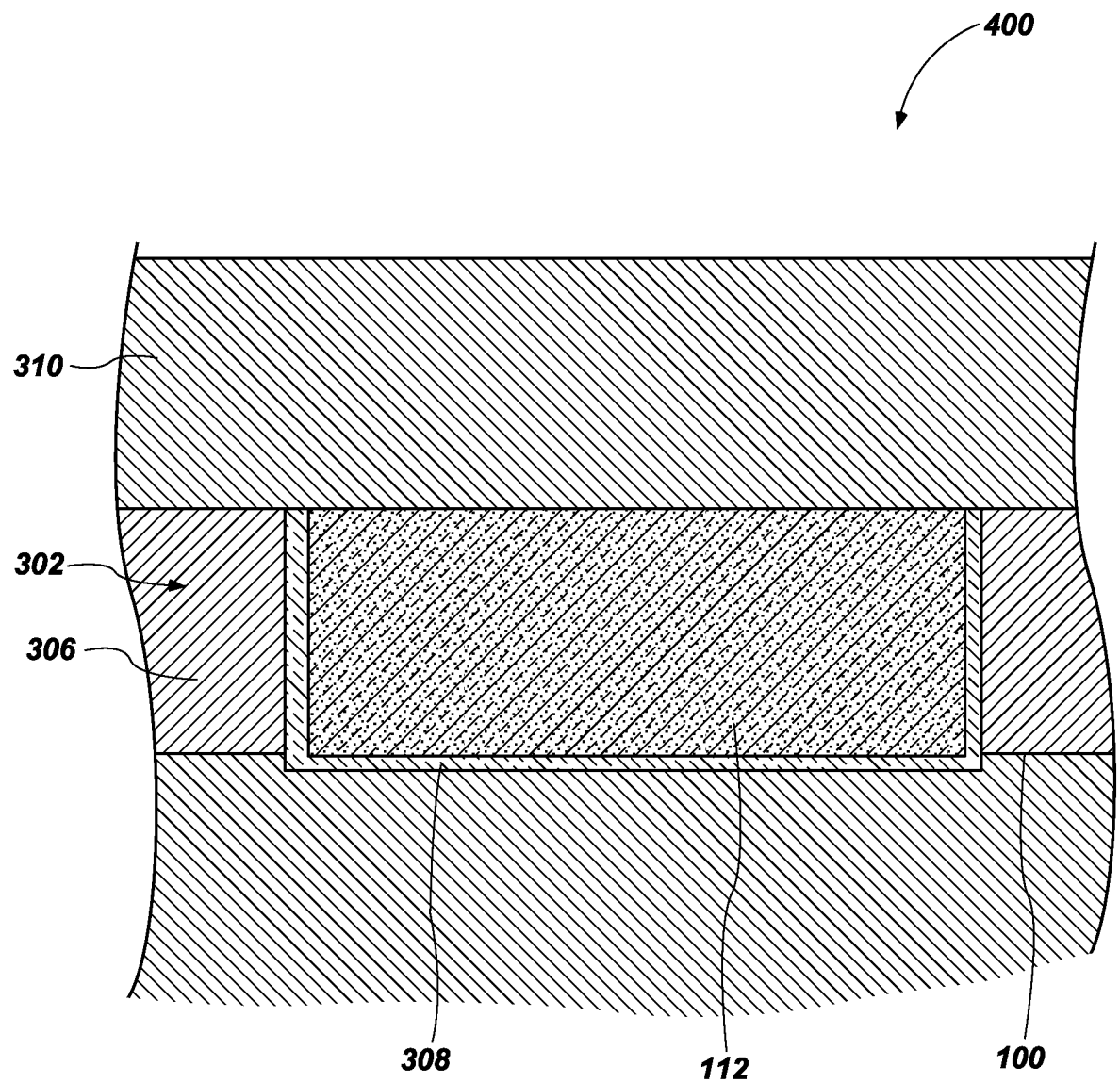
FIG. 4 is a cross-sectional view of a first intermediate product in a method of making the capacitor of FIG. 3.

FIG. 4 is a cross-sectional view of a first intermediate product 400 in a method of making the capacitor 300 of FIG. 3. When making the first intermediate product 400, and with combined reference to FIG. 3 and FIG. 4, the passivation material 310 may be placed over the last layer of the interconnect 302 on a side of that layer opposite the substrate 100. For example, the passivation material 310 may be in direct contact with, and may cover, the first plate 112, any exposed portions of the barrier material 308 partially surrounding the first plate 112, and the other dielectric material 306 in which the barrier material 308 and the first plate 112 may be embedded. The passivation material 310 may be put in place utilizing, for example, plasma-enhanced chemical vapor deposition (PEVCD).

FIG. 5 is a cross-sectional view of a second intermediate product 500 in the method of making the capacitor 300 of FIG. 3. When making the second intermediate product 500, and with combined reference to FIG. 3 and FIG. 5, a protective material 502 may be placed on a surface of the passivation material 310 opposite the substrate 100. The protective material 502 may include, for example, a photoresist material. A mask may be placed over those portions of the protective material 502 that are to remain and protect underlying portions of the passivation material 310, and remaining portions of the protective material 502 may be removed (e.g., by exposure to light). Exposed portions of the passivation material 310 not directly underlying the protective material 502 may be removed, forming the first hole 312 and the second hole 314 and exposing the surface 318 of the first plate 112 within the first hole 312 and the second hole 314. Removal of the exposed portions of the passivation material 310 may be accomplished by, for example, an etching process.

Figure 6:
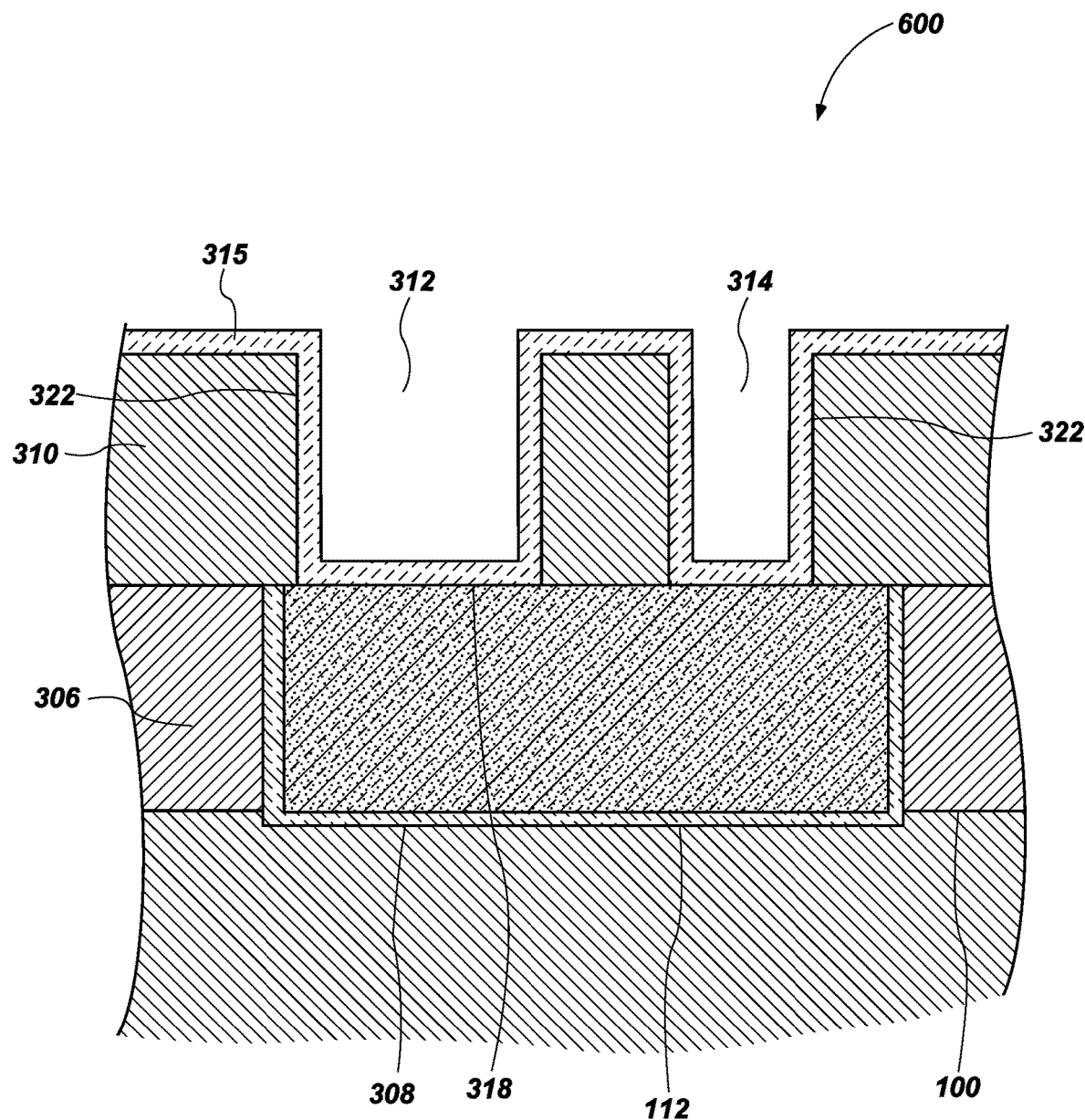
FIG. 6 is a cross-sectional view of a third intermediate product in the method of making the capacitor of FIG. 3.

FIG. 6 is a cross-sectional view of a third intermediate product 600 in the method of making the capacitor 300 of FIG. 3. Before making the third intermediate product 600, and with combined reference to FIG. 3 and FIG. 6, the protective material 502 (see FIG. 5) may be removed (e.g., by mechanically stripping protective material 502, exposing the protective material 502 to light, dissolving the protective material 502 in a solvent, and/or performing any combination of these). A dielectric material 315 may be placed over the exposed surfaces of the passivation material 310 and the first plate 112. For example, the dielectric material 315 may be in direct contact with, and may cover, a surface of the passivation material 310 located on a side of the passivation material 310 opposite the substrate 100, the portions of the surface 318 of the first plate 112 in the first hole 312 and the second hole 314, and the sidewalls 322 of the passivation material 310 defining the first hole 312 and the second hole 314. The dielectric material 315 may be put in place utilizing, for example, plasma-enhanced chemical vapor deposition (PEVCD).

Figure 7:
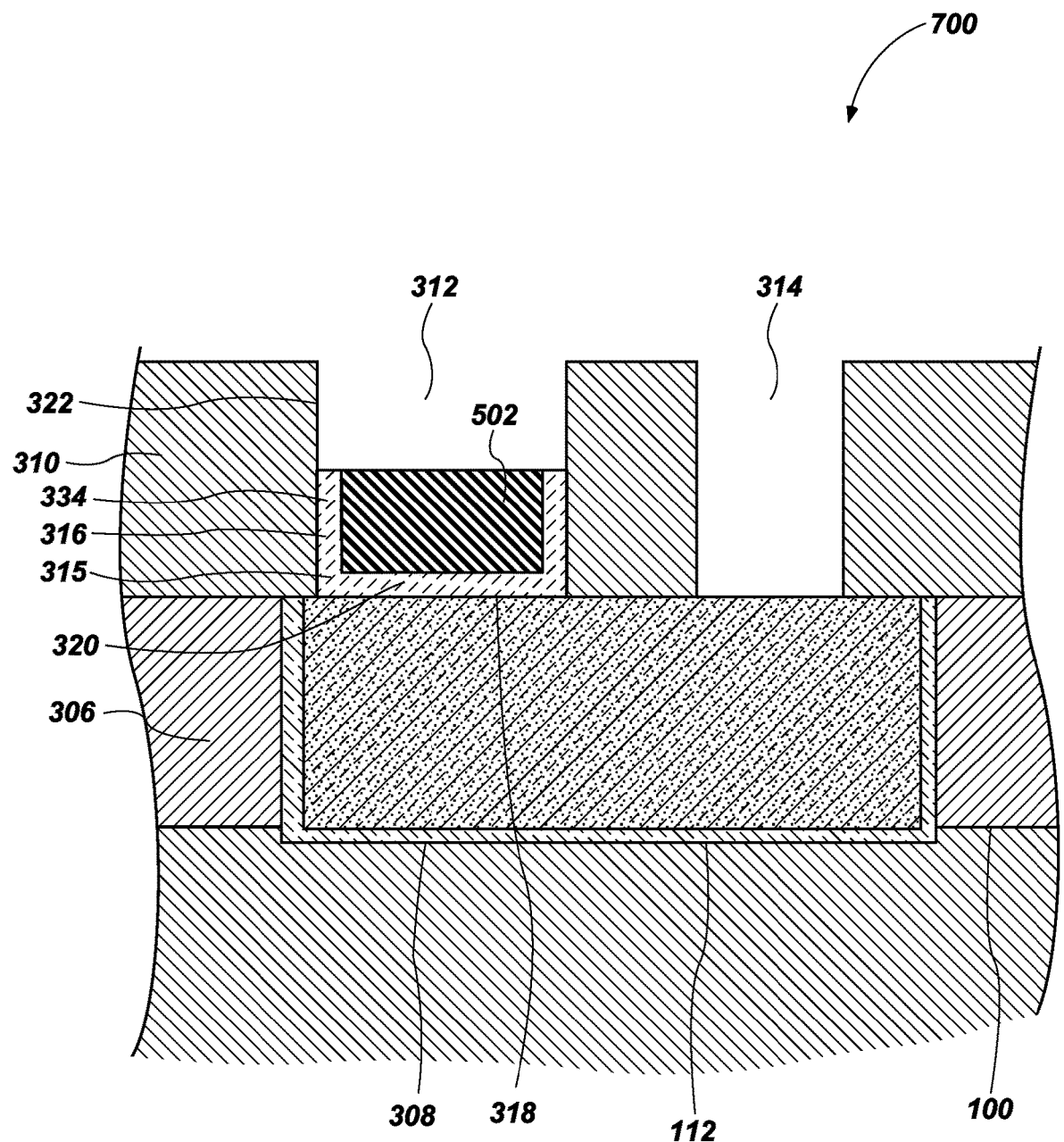
FIG. 7 is a cross-sectional view of a fourth intermediate product in the method of making the capacitor of FIG. 3.

FIG. 7 is a cross-sectional view of a fourth intermediate product 700 in the method of making the capacitor 300 of FIG. 3. When making the fourth intermediate product 700, and with combined reference to FIG. 3 and FIG. 7, another quantity of the protective material 502 may be placed on the dielectric material 315 on a side of the dielectric material 315 opposite the substrate 100. A mask may be placed over those portions of the protective material 502 that are to remain and protect underlying portions of the dielectric material 315, and remaining portions of the protective material 502 may be removed (e.g., by exposure to light). Exposed portions of the dielectric material 315 not directly underlying the protective material 502 may be removed, leaving the dielectric region 316 of the capacitor 300 (see FIG. 3) and exposing a remainder of the first hole 312, an entirety of the second hole 314 and the surface 318 of the first plate 112 within the second hole 314, and the surface of the passivation material 310 located opposite the substrate 100. Removal of the exposed portions of the dielectric material 315 may be accomplished by, for example, an etching process.

The protective material 502 may then be removed utilizing any combination or subcombination of the processes discussed previously in connection with FIG. 6. Thereafter, electrically conductive material may be placed in the remainder of the first hole 312 and in the second hole 314, forming the second plate 110 and the electrical connection 330. Electrically conductive material may be placed utilizing, for example, physical vapor deposition (PVD). Thereafter, the capacitor 300 may be at least substantially complete, forming the structure shown in FIG. 3.

Figure 8:
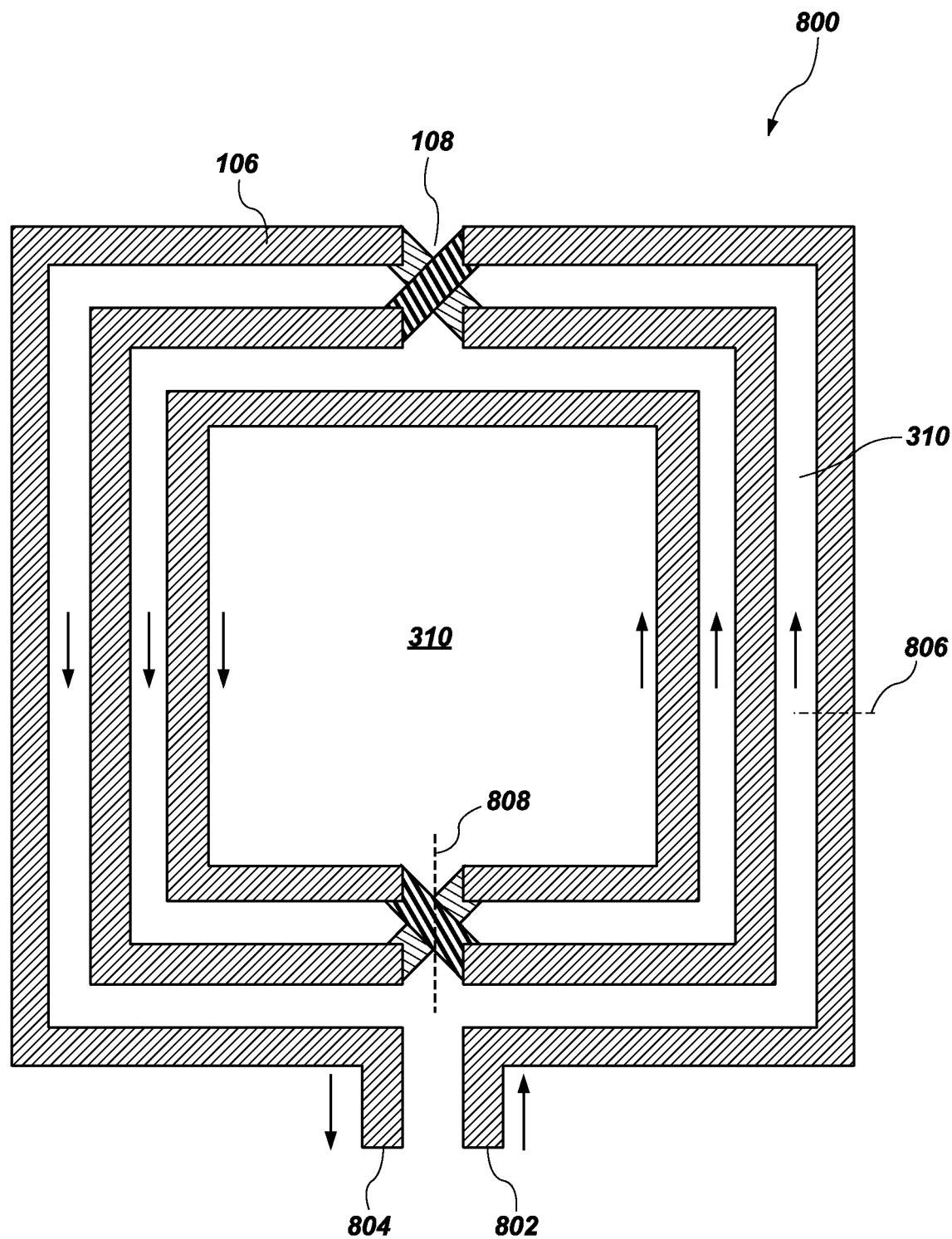
FIG. 8 is a plan view of an illustrative inductor usable to form the inductor-capacitor oscillator of FIG. 1.

FIG. 8 is a plan view of an illustrative inductor 800 usable to form the inductor-capacitor oscillator of FIG. 1. The inductor 800 may be located in the same layers on the substrate 100 described previously in connection with certain embodiments for the capacitor 300 (see FIG. 3) where the capacitor 300 is formed at least partially while forming the BEOL structure. The inductor 800 may include coils 106 extending from an input location 802 to an output location 804, the coils 106 forming a winding path from a radially outermost coil to a radially innermost coil and back again (or vice versa). The coils 106 may be formed from, for example, wires, lines, traces, and/or other structures for directing electrical current through the inductor 800. Quantities of electrically insulating material, such as, for example, the passivation material 310 (see FIG. 3) may be located, for example, at a radial center of the inductor 800 (e.g., radially within the coils 106) and radially between each adjacent one of coils 106. The coils 106 may have a generally rectangular (e.g., square), polygonal (e.g., hexagonal, octagonal), or circular shape when viewed in a plane parallel to a major surface of the substrate 100 (see FIG. 1). The shape, size, and spacing of the coils 106 may depend on, for example, magnetic flux, length, and resistance specifications for the inductor 800. In some embodiments, the coils 106 may be symmetrical (e.g., having essentially the same mirrored shape about a line of symmetry, but for multiple overpass/underpass regions 108). In other embodiments, the coils 106 may be asymmetrical (e.g., having at least one difference when mirrored about a line of symmetry, such as having an overpass/underpass region 108 on one lateral side without a corresponding overpass/underpass region 108 on the opposite lateral side).

Electrically isolated portions of the coils 106 within the overpass/underpass regions 108 are depicted in FIG. 8 as being oriented at oblique angles relative to the other portions of the coils 106. However, electrically isolated portions of the coils 106 within the overpass/underpass regions 108 may take any path leading between the coils 106 within the plane of the respective isolated portion, such as, for example, a stair-step pattern with portions of the stairs alternately extending parallel, then perpendicular, then parallel and so on to the remainders of the coils 106. In addition, inductors 800 in accordance with this disclosure may include any number of coils 106 (e.g., turns). Additional detail regarding the previously mentioned varying thicknesses of the coils 106 in different locations around the coils 106 may be gleaned from a comparison of FIG. 9 to FIG. 10, which depict a cross-section of the coils 106 outside (FIG. 9) and inside (FIG. 10) the overpass/underpass regions 108.

Figure 9:
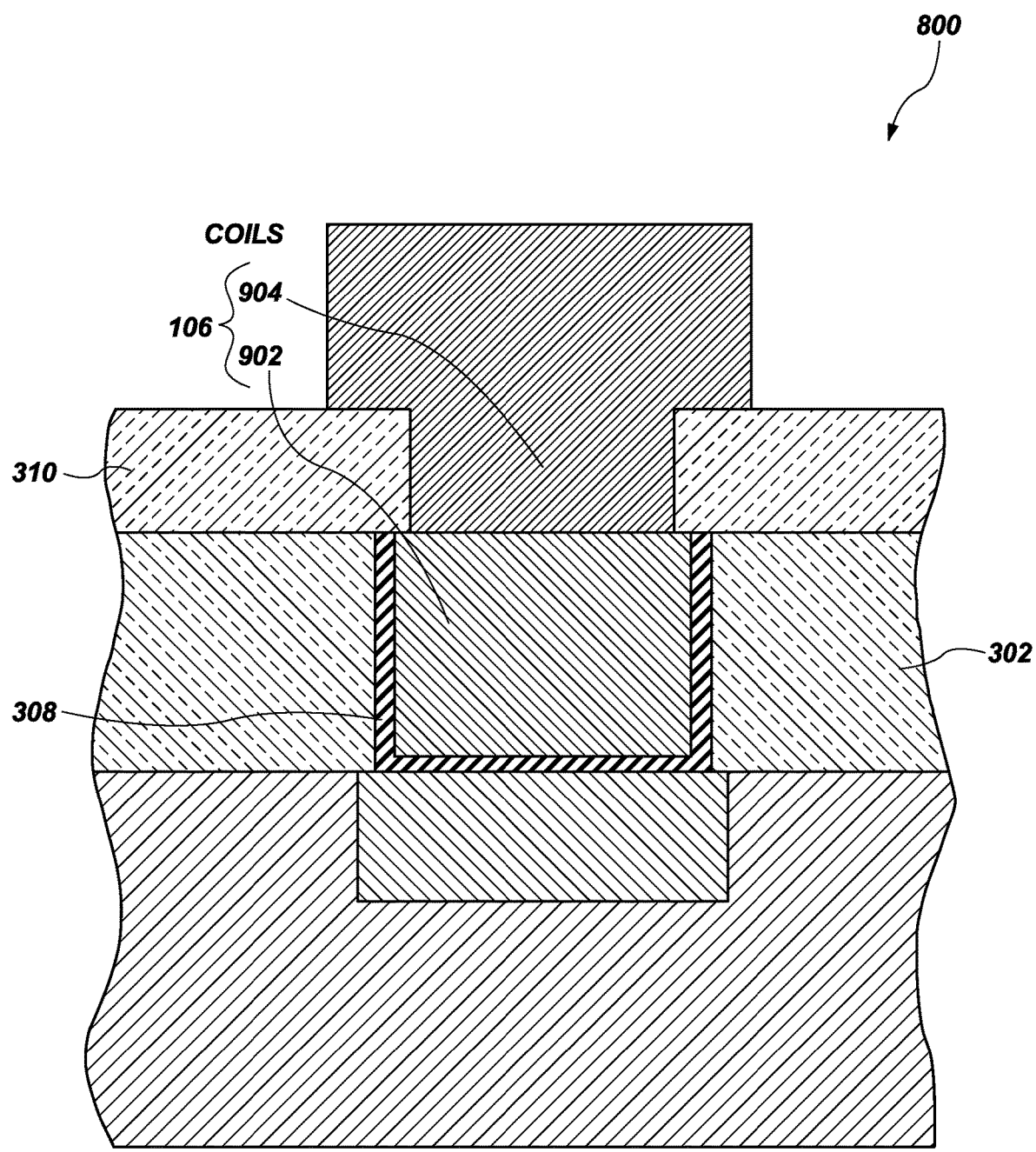
FIG. 9 is a cross-sectional view of another portion of the integrated inductor of FIG. 8.

FIG. 9 is a cross-sectional view of a first portion of the integrated inductor 800 of FIG. 8 taken along line 806. The portion depicted in FIG. 9 may correspond to those portions of the coils 106 not forming the overpass/underpass regions 108. In such sections, the coils 106 may include a first quantity of electrically conductive material 902 embedded within the dielectric material of the interconnect 302, and a second quantity of electrically conductive material 904 embedded within the passivation material 310 of the BEOL structure in direct contact with the first quantity of electrically conductive material 902. More specifically, the first quantity of electrically conductive material 902 may be, for example, partially surrounded by the barrier material 308, embedded within the other dielectric material 306, and formed as part of a final layer of the interconnect 302, similar to the first plate 112 of the capacitor 300 (see FIG. 3). At least a portion of the second quantity of electrically conductive material 904 may be, for example, laterally surrounded by the passivation material 310, and the second quantity of electrically conductive material 904 may be formed as part of the first layer of the BEOL structure, similar to the second plate 110 of the capacitor 300 (see FIG. 3). These sections of the coils 106 may be formed utilizing procedures described previously in connection with FIGS. 4 through 7 depicting formation of the capacitor 300, and particularly those procedures relating to the first plate 112 and the electrical connection 330.

Figure 10:
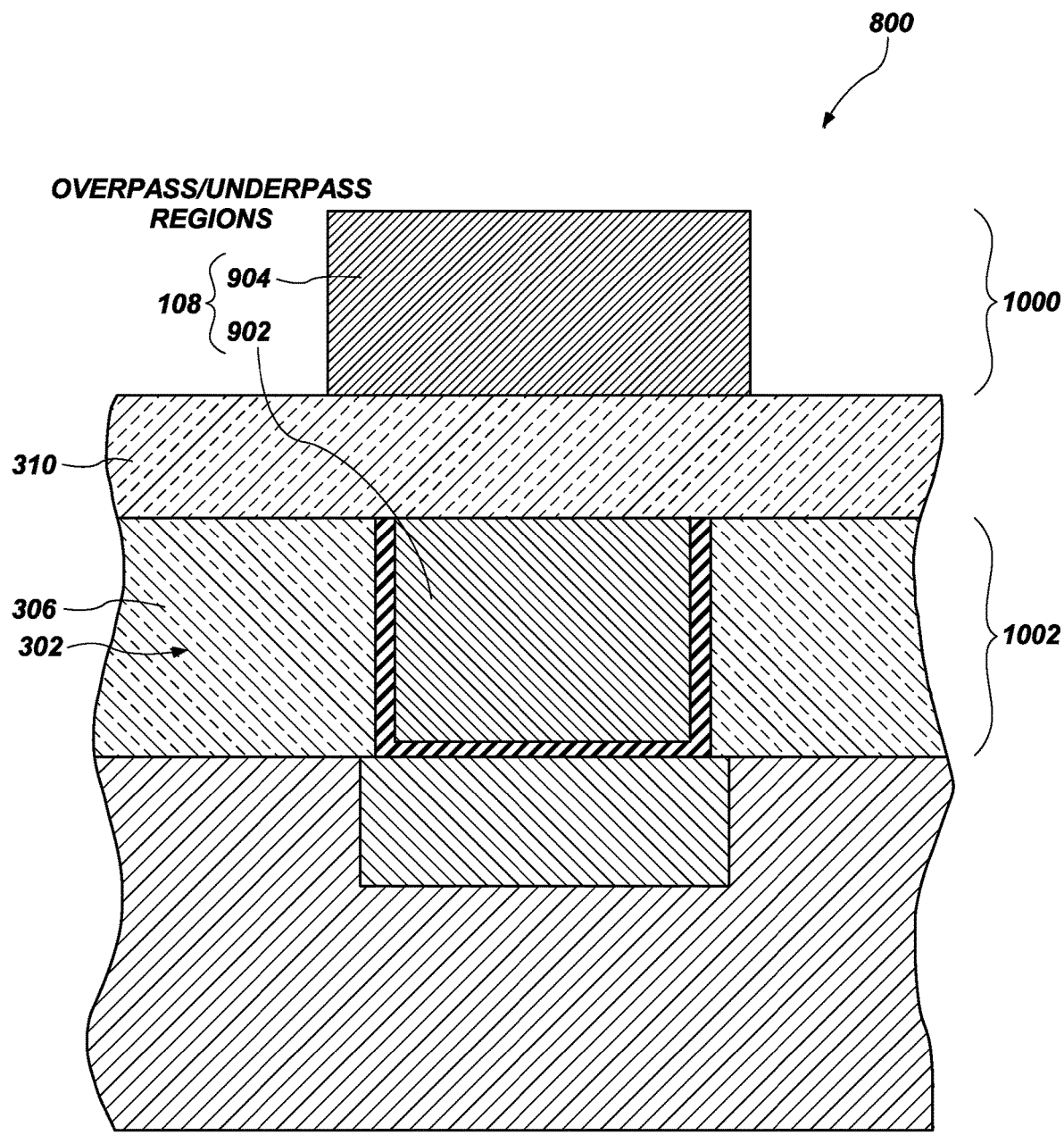
FIG. 10 is a cross-sectional view of a first portion of the inductor of FIG. 8.

FIG. 10 is a cross-sectional view of another portion of the inductor 800 of FIG. 8 taken along line 808. The portion depicted in FIG. 3 may correspond to those portions of the coils 106 forming the overpass/underpass regions 108. In such sections, one of the coils 106 passing under may include the first quantity of electrically conductive material 902 embedded within the other dielectric material 306 of the interconnect 302, forming a first layer 1002. Another of the coils 106 passing over may include the second quantity of electrically conductive material 904 supported on the passivation material 310 of the BEOL structure, forming a second layer 1000. The passivation material 310 may physically, electrically, and operatively isolate the first quantity of electrically conductive material 902 from the second quantity of electrically conductive material 904. These sections of the coils 106 may be formed utilizing procedures described previously in connection with FIGS. 4 through 7 depicting formation of the capacitor 300, except that no opening in the passivation material 310 may be formed within the overpass/underpass regions 108, keeping the first quantity of electrically conductive material 902 separated from the second quantity of electrically conductive material 904 by the passivation material 310.

Figure 11:
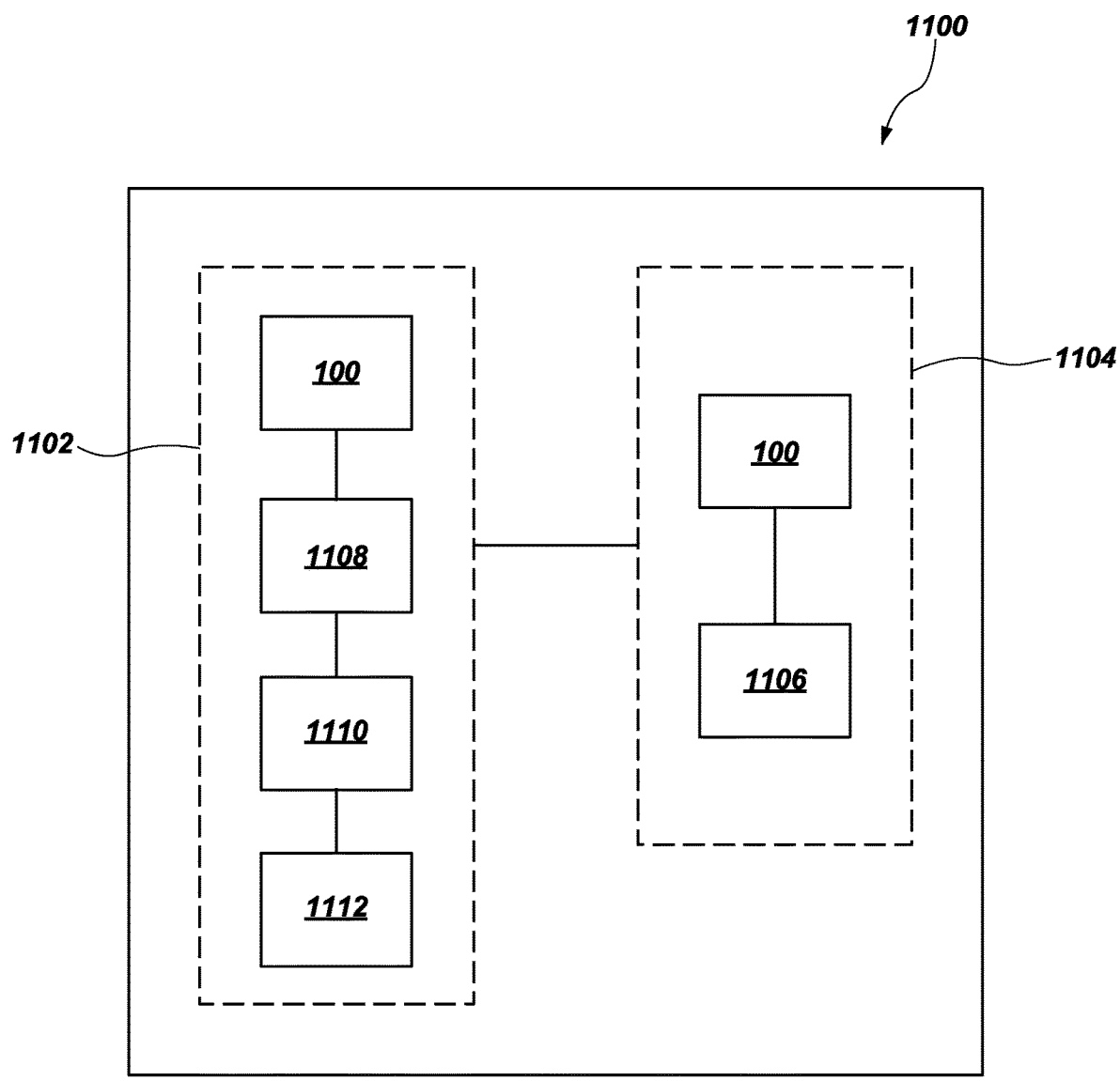
FIG. 11 is a schematic diagram of an electronic system including the substrate of FIG. 1.

FIG. 11 is a schematic diagram of an electronic system 1100 including the substrate of FIG. 1. For example, the electronic system 1100 may include a control unit 1102 and a probe unit 1104. The probe unit 1104 may include a sensor device 1106 configured to generate an electrical signal representative of, and in response to, a detected physical phenomenon. The probe unit 1104 may be a portable device, such as, for example, a handheld device. In some embodiments, the probe unit 1104 may include a semiconductor device including a substrate 100 in accordance with this disclosure located within the probe unit 1104, the substrate 100 of the semiconductor device configured to at least partially process the electrical signal locally within the probe unit 1104. The probe unit 1104 may be operatively connected to the control unit 1102 (e.g., over a wired or wireless connection) and may send the raw, partially processed, or fully processed electrical signal to the control unit 1102. In some embodiments, the control unit 1102 may include another semiconductor device having a substrate 100 in accordance with this disclosure and/or a microprocessor 1108, which may process or further process the electrical signal. The control unit 1102 may include a memory device 1110 (i.e., a physical, hardware memory device that is not a transitory signal) configured to store the results of the fully processed electrical signal. The control unit 1102 may optionally include an output device 1112 (e.g., an electronic display, an audio speaker, a printer, without limitation) configured to output the results of the fully processed electrical signal.

When compared to conventional configurations of, and techniques for forming, integrated inductor-capacitor oscillators, configurations of, and techniques for forming, integrated inductor-capacitor oscillators in accordance with this disclosure may involve performing fewer process acts, have greater synergy with process acts used for forming other structures (e.g., bond pads, interconnects, BEOL structures), reduce reliance on dedicated process acts and interconnection structures (e.g., vias and those acts for forming vias), and produce higher-quality integrated inductor-capacitor oscillators. For example, techniques for forming integrated inductor-capacitor oscillators in accordance with this disclosure may enable one or more components of integrated inductor-capacitor oscillators to be formed concurrently with, and using the same materials as, bond pads of the same semiconductor device. As another example, integrated inductor-capacitor oscillators having configurations in accordance with this disclosure may have higher inductance, lower resistance, lower capacitance inductors, and higher breakdown voltage capacitors, producing higher-quality integrated inductor-capacitor oscillators.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventor.

What is claimed is:

1. A system-on-chip, comprising:
an inductor-capacitor oscillator monolithically integrated into the system-on-chip;
wherein the inductor comprises portions of coils within two adjacent layers supported on a semiconductor substrate of the system-on-chip and overpass regions and underpass regions interconnecting the portions of the coils, the overpass regions located within one of the two adjacent layers, the underpass regions located within another of the two adjacent layers;
wherein at least substantial entireties of the coils of the inductor located outside the overpass regions and the underpass regions comprise a first quantity of electrically conductive material in a first of the two adjacent layers and a second quantity of electrically conductive material in a second of the two adjacent layers, the second quantity of electrically conductive material in direct contact with the first quantity of electrically conductive material, the second quantity of electrically conductive material located outside the overpass regions and the underpass regions comprising a monolithic, contiguous mass of the electrically conductive material partially embedded within a passivation material in the second of the two adjacent layers; and
wherein the overpass regions and the underpass regions interconnecting the portions of the coils comprise the passivation material between the first quantity of electrically conductive material and the second quantity of electrically conductive material, the second quantity of electrically conductive material not being embedded within the passivation material within the overpass regions and the underpass regions.

2. The system-on-chip of claim 1, wherein at least a portion of a capacitor of the inductor-capacitor oscillator is part of a back-end-of-line (BEOL) structure of the system-on-chip.

3. The system-on-chip of claim 2, wherein a first plate of the capacitor is located within a first, underlying layer supported on the semiconductor substrate of the system-on-chip, a second plate of the capacitor is located within a second layer supported on the semiconductor substrate of the system-on-chip, and a dielectric material is located between the first plate and the second plate.

4. The system-on-chip of claim 3, wherein a transition from a surface of the second plate facing the first plate to a lateral side surface of the second plate is rounded.

5. The system-on-chip of claim 3, wherein the dielectric material extends laterally between the second plate and the first plate and longitudinally along a portion of a periphery of the second plate, such that the dielectric material at least substantially forms a cup shape.

6. The system-on-chip of claim 3, wherein the second plate is formed as a first bond pad formed in the BEOL structure.

7. The system-on-chip of claim 6, wherein an electrical connection to the first plate comprises a second bond pad formed in the BEOL structure.

8. The system-on-chip of claim 3, wherein the second plate comprises a copper or copper alloy material and the first plate comprises an aluminum or aluminum alloy material.

9. The system-on-chip of claim 1, wherein a capacitor of the inductor-capacitor oscillator is a poly-oxide-poly (POP) capacitor.

10. The system-on-chip of claim 1, wherein the inductor-capacitor oscillator forms at least a portion of a timing signal generator.

11. The system-on-chip of claim 1, wherein the inductor-capacitor oscillator is monolithically integrated with other integrated circuitry of the system-on-chip.

12. A method of making an integrated oscillator for a system-on-chip, comprising:
forming an inductor on a semiconductor substrate by forming portions of coils of a first thickness and forming overpass regions and underpass regions of a second, lesser thickness interconnecting the portions of coils, wherein forming the inductor comprises:
supporting the portions of coils of the inductor within two adjacent layers on the semiconductor substrate and interconnecting the portions of coils utilizing the overpass regions and the underpass regions, the overpass regions located within one of the two adjacent layers, the underpass regions located within another of the two adjacent layers;
forming at least substantial entireties of coils of the inductor located outside the overpass regions and the underpass regions to comprise a first quantity of electrically conductive material in a first of the two adjacent layers and a second quantity of electrically conductive material in a second of the two adjacent layers, the second quantity of electrically conductive material in direct contact with the first quantity of electrically conductive material, the second quantity of electrically conductive material located outside the overpass regions and the underpass regions comprising a monolithic, contiguous mass of the electrically conductive material partially embedded within a passivation material in the second of the two adjacent layers; and
forming the overpass regions and the underpass regions interconnecting the portions of coils to comprise the passivation material between the first quantity of electrically conductive material and the second quantity of electrically conductive material, the second quantity of electrically conductive material not being embedded within the passivation material within the overpass regions and the underpass regions;
forming a capacitor supported on and/or embedded within the semiconductor substrate before, or while, forming the inductor; and
connecting the inductor to the capacitor to form integrated monolithically integrated inductor-capacitor oscillator.

13. The method of claim 12, further comprising trimming a capacitance of the inductor-capacitor oscillator utilizing a bank of capacitors comprising the capacitor.

14. The method of claim 12, wherein forming the capacitor comprises:
forming a first plate of the capacitor within an uppermost layer of an interconnect on the semiconductor substrate;
placing the passivation material over the first plate;
forming a first hole and a second hole through the passivation material to expose a respective portion of the first plate within each of the first hole and the second hole;
forming a dielectric region of the capacitor by placing a dielectric material within a portion of the first hole, the dielectric material covering the respective portion of the first plate proximate to the first hole; and forming a second plate of the capacitor and an electrical connection to the first plate by placing another first quantity of an electrically conductive material within a remainder of the first hole in contact with the dielectric material.

15. The method of claim 14, further comprising forming an electrical connection to the first plate by placing a second quantity of the electrically conductive material within the second hole in contact with the respective portion of the first plate proximate to the second hole.

16. The method of claim 14, wherein forming the dielectric region comprises:
   blanket depositing the dielectric material over a surface of the passivation material located opposite the first plate, over side surfaces of the passivation material defining the first hole and the second hole, and over the respective portions of the first plate within the first hole and the second hole;
   placing a protective material within a portion of the first hole over a portion of the dielectric material proximate to the first plate;
   removing a remainder of the dielectric material not in contact with the protective material, revealing the passivation material and the respective portion of the first plate within the second hole; and
   removing the protective material.

17. The method of claim 16, wherein placing the first quantity of the electrically conductive material within the remainder of the first hole in contact with the dielectric material comprises rounding a transition from a surface of the second plate facing the first plate to a lateral side surface of the second plate by conforming the first quantity of the electrically conductive material to a shape of the dielectric material within the first hole.

18. A clock module for a microcontroller, comprising:
   an inductor-capacitor oscillator monolithically integrated into a substrate comprising a semiconductor material, the inductor-capacitor oscillator comprising:
      an inductor supported on the substrate, the inductor comprising portions of coils within two adjacent layers supported on the substrate and overpass regions and underpass regions interconnecting the portions of the coils, the overpass regions located within one of the two adjacent layers, the underpass regions located within another of the two adjacent layers; and
      a capacitor operatively connected to the inductor, the capacitor located on the substrate or embedded within the semiconductor material of the substrate,
   wherein at least substantial entireties of the coils of the inductor located outside the overpass regions and the underpass regions comprise a first quantity of electrically conductive material in a first of the two adjacent layers and a second quantity of electrically conductive material in a second of the two adjacent layers, the second quantity of electrically conductive material in direct contact with the first quantity of electrically conductive material, the second quantity of electrically conductive material located outside the overpass regions and the underpass regions comprising a monolithic, contiguous mass of the electrically conductive material partially embedded within a passivation material in the second of the two adjacent layers; and
   wherein the overpass regions and the underpass regions interconnecting the portions of the coils comprise the passivation material between the first quantity of electrically conductive material and the second quantity of electrically conductive material, the second quantity of electrically conductive material not being embedded within the passivation material within the overpass regions and the underpass regions.

19. An electronic system, comprising:
a microcontroller comprising:
   an inductor-capacitor oscillator monolithically integrated into a substrate comprising a semiconductor material, the inductor-capacitor oscillator comprising:
      an inductor supported on the substrate, the inductor comprising portions of coils within two adjacent layers supported on the substrate and overpass regions and underpass regions interconnecting the portions of the coils, the overpass regions located within one of the two adjacent layers, the underpass regions located within another of the two adjacent layers; and
      a capacitor operatively connected to the inductor, the capacitor located on the substrate or embedded within the semiconductor material of the substrate; and
   at least one of an input device, a memory device, an output device, or a sensor device operatively connected to the microcontroller, wherein the microcontroller is configured to transmit control signals to the at least one of the input device, the memory device, the output device, or the sensor device, at least partially utilizing the inductor-capacitor oscillator,
   wherein at least substantial entireties of coils of the inductor located outside the overpass regions and the underpass regions comprise a first quantity of electrically conductive material in a first of the two adjacent layers and a second quantity of electrically conductive material in a second of the two adjacent layers, the second quantity of electrically conductive material in direct contact with the first quantity of electrically conductive material, the second quantity of electrically conductive material located outside the overpass regions and the underpass regions comprising a monolithic, contiguous mass of the electrically conductive material partially embedded within a passivation material in the second of the two adjacent layers; and
   wherein the overpass regions and underpass regions interconnecting the portions of coils comprise the passivation material between the first quantity of electrically conductive material and the second quantity of electrically conductive material, the second quantity of electrically conductive material not being embedded within the passivation material within the overpass regions and the underpass regions.

* * * * *